(12) United States Patent
Li et al.

(10) Patent No.: US 11,589,463 B2
(45) Date of Patent: Feb. 21, 2023

(54) CIRCUIT BOARD WITH AT LEAST ONE EMBEDDED ELECTRONIC COMPONENT AND METHOD FOR MANUFACTURING THE SAME

(71) Applicants: Avary Holding (Shenzhen) Co., Limited., Shenzhen (CN); QING DING PRECISION ELECTRONICS (HUAIAN) CO., LTD, Huai an (CN); GARUDA TECHNOLOGY CO., LTD., New Taipei (TW)

(72) Inventors: Jia-He Li, Shenzhen (CN); Yong-Chao Wei, Qinhuangdao (CN)

(73) Assignees: Avary Holding (Shenzhen) Co., Limited., Shenzhen (CN); QING DING PRECISION ELECTRONICS (HUAIAN) CO., LTD, Huai an (CN); GARUDA TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 17/330,972

(22) Filed: May 26, 2021

(65) Prior Publication Data
US 2022/0377906 A1 Nov. 24, 2022

(30) Foreign Application Priority Data

May 7, 2021 (CN) .......................... 202110493859.0

(51) Int. Cl.
*H05K 3/02* (2006.01)
*H05K 1/18* (2006.01)
*H05K 3/32* (2006.01)

(52) U.S. Cl.
CPC ............... *H05K 3/02* (2013.01); *H05K 1/183* (2013.01); *H05K 1/189* (2013.01); *H05K 3/32* (2013.01)

(58) Field of Classification Search
CPC .......... H05K 3/02; H05K 1/183; H05K 1/189; H05K 3/32; H01L 24/97; Y10T 29/4913; Y10T 29/49146; Y10T 29/49155
USPC ......................................... 29/832, 841, 846
See application file for complete search history.

(56) References Cited

U.S. PATENT DOCUMENTS

| | | | |
|---|---|---|---|
| 7,246,431 B2* | 7/2007 | Bang ....................... | H01L 24/97 29/832 |
| 7,498,201 B2* | 3/2009 | Meyers ............... | H01L 25/0657 438/118 |
| 2005/0158911 A1* | 7/2005 | Uwada .................... | H05K 1/186 257/E23.177 |

(Continued)

*Primary Examiner* — Donghai D Nguyen
(74) *Attorney, Agent, or Firm* — ScienBiziP, P.C.

(57) ABSTRACT

A method for manufacturing a circuit board including the following steps: providing a flexible double-sided metal-clad laminate including a first metal foil, a flexible dielectric layer, and a second metal foil. A carrier is attached to the second metal foil. A first wiring layer including a first wiring region and a second wiring region is formed by the first metal foil. The first wiring region includes a first connecting pad, and the second wiring region includes a connecting pad. A plurality of rigid dielectric blocks surrounded to form an interval and a first groove exposing the first connecting pad is pressed on the flexible dielectric layer to form a rigid dielectric layer. An electronic component is fixed the first groove. The carrier is removed. The intermediate structure is bent along the interval and pressed. A second wiring layer is formed by the second metal foil.

9 Claims, 12 Drawing Sheets

(56) References Cited

U.S. PATENT DOCUMENTS

2006/0043562 A1\* 3/2006 Watanabe ............ H05K 1/0233
438/455

\* cited by examiner

CIRCUIT BOARD WITH AT LEAST ONE EMBEDDED ELECTRONIC COMPONENT AND METHOD FOR MANUFACTURING THE SAME

FIELD

The subject matter herein generally relates to a circuit board, especially relates to a circuit board with at least one embedded electronic component and a method for manufacturing the circuit board with the embedded electronic component.

BACKGROUND

Circuit board embedded component technology mainly embeds electronic components inside the circuit board, so that the circuit board module has the advantages of miniaturization, shortening the connection path between components, and reducing transmission loss. It can realize portable electronic equipment A technological approach that is smaller and lighter, multi-functional and high-performance. In the prior art, a groove is usually formed on the substrate first, the components are embedded in the groove, and then the outer substrate is laminated for packaging. However, the above-mentioned process load, and the multi-layer circuit needs to be produced by partial pressure and then laminated, which takes a long time.

Therefore, there is room for improvement within the art.

BRIEF DESCRIPTION OF THE DRAWINGS

Implementations of the present disclosure will now be described, by way of embodiments, with reference to the attached figures.

FIG. 5b is a top view of an embodiment of rigid dielectric layer on the flexible wiring board of FIG. 5a.

FIG. 5c is a top view of another embodiment of rigid dielectric layer on the flexible wiring board of FIG. 5a.

FIG. 6 is a cross-sectional view showing a first electronic component fixed on the flexible wiring board of FIG. 5a.

DETAILED DESCRIPTION

Figure 1:
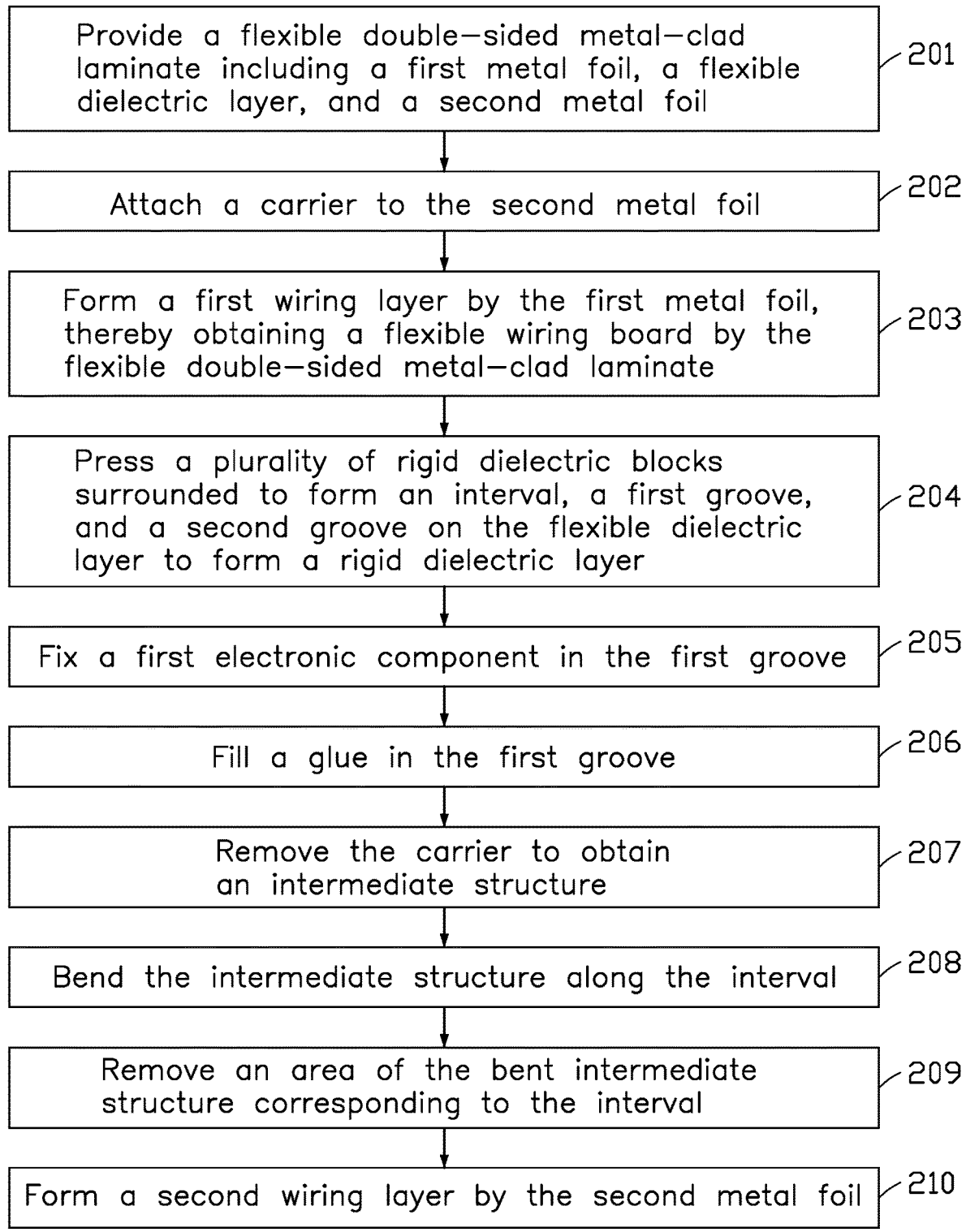
FIG. 1 is a flowchart of an embodiment of a method for manufacturing a circuit board.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

FIG. 1 illustrates a flowchart of a method in accordance with an embodiment. The embodiment method for manufacturing a circuit board with at least one embedded electronic component is provided by way of embodiments, as there are a variety of ways to carry out the method. Each block shown in FIG. 1 represents one or more processes, methods, or subroutines carried out in the method. Furthermore, the illustrated order of blocks can be changed. Additional blocks may be added or fewer blocks may be utilized, without departing from this disclosure. The method can begin at block 201.

Figure 2:
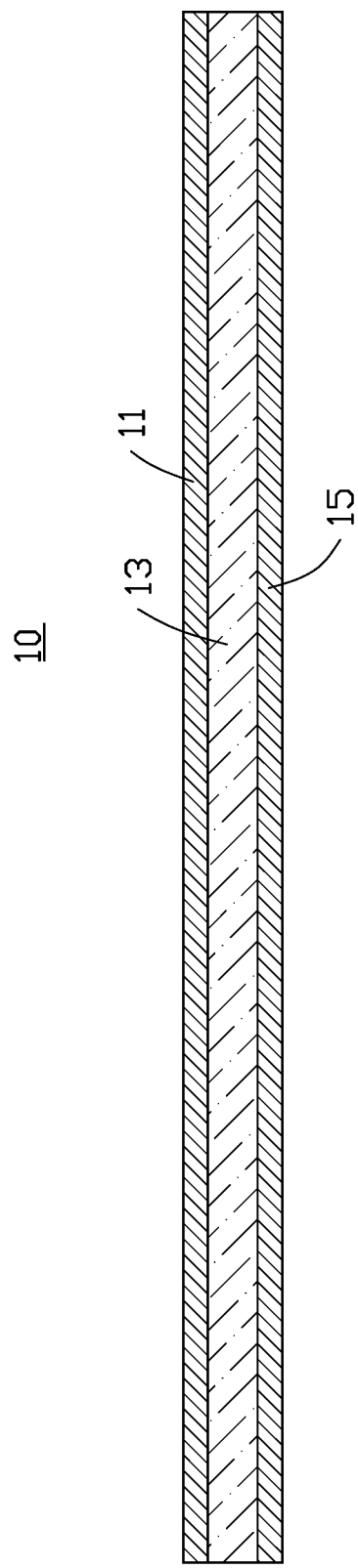
FIG. 2 is a cross-sectional view of an embodiment of a flexible double-sided metal-clad laminate.

At block 201, referring to FIG. 2, a flexible double-sided metal-clad laminate 10 is provided. The flexible double-sided metal-clad laminate 10 includes a first metal foil 11, a flexible dielectric layer 13, and a second metal foil 15 stacked in sequence.

The flexible dielectric layer 13 may include, but is not limited to, at least one of a polyimide (PI) film, a liquid crystal polymer (LCP) film, a polyethylene terephthalate (PET) film, and a polyethylene naphthalate (PEN) film. In at least one embodiment, the flexible dielectric layer 13 is a polyimide film.

The first metal foil 11 may be made of a material selected from a group consisting of copper, silver, nickel, gold, and any combination thereof In at least one embodiment, the flexible double-sided metal-clad laminate 10 may be a double-sided copper-clad laminate.

Figure 3:
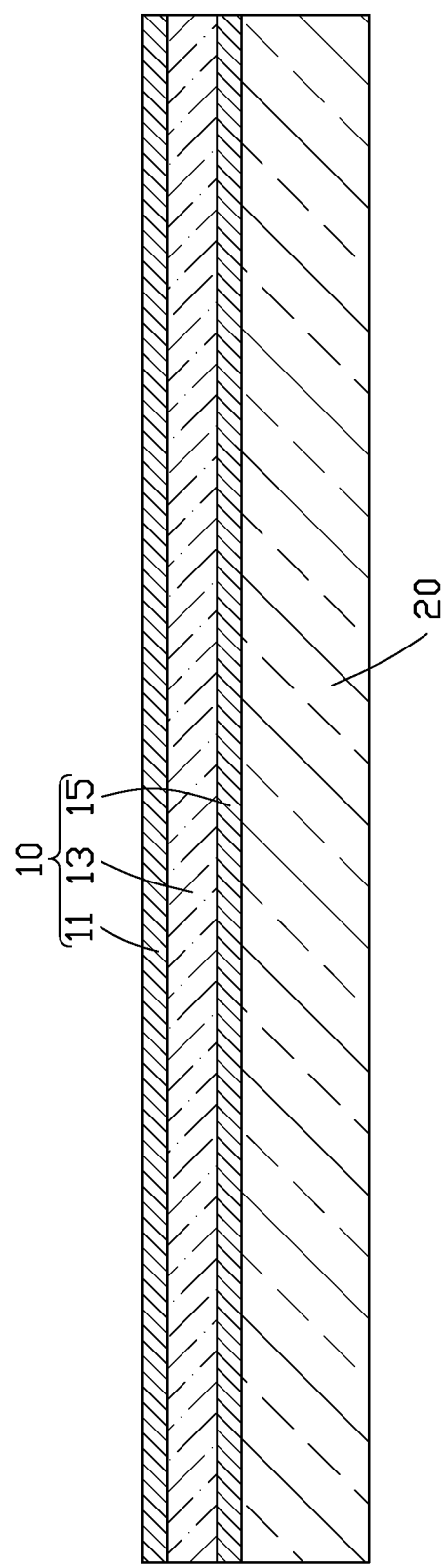
FIG. 3 is a cross-sectional view showing a carrier on the flexible double-sided metal-clad laminate of FIG. 2.

At block 202, referring to FIG. 3, the flexible double-sided metal-clad laminate 10 is attached to a carrier 20. A side of the second metal foil 15 facing away from the flexible dielectric layer 13 is combined with the carrier 20.

Figure 4:
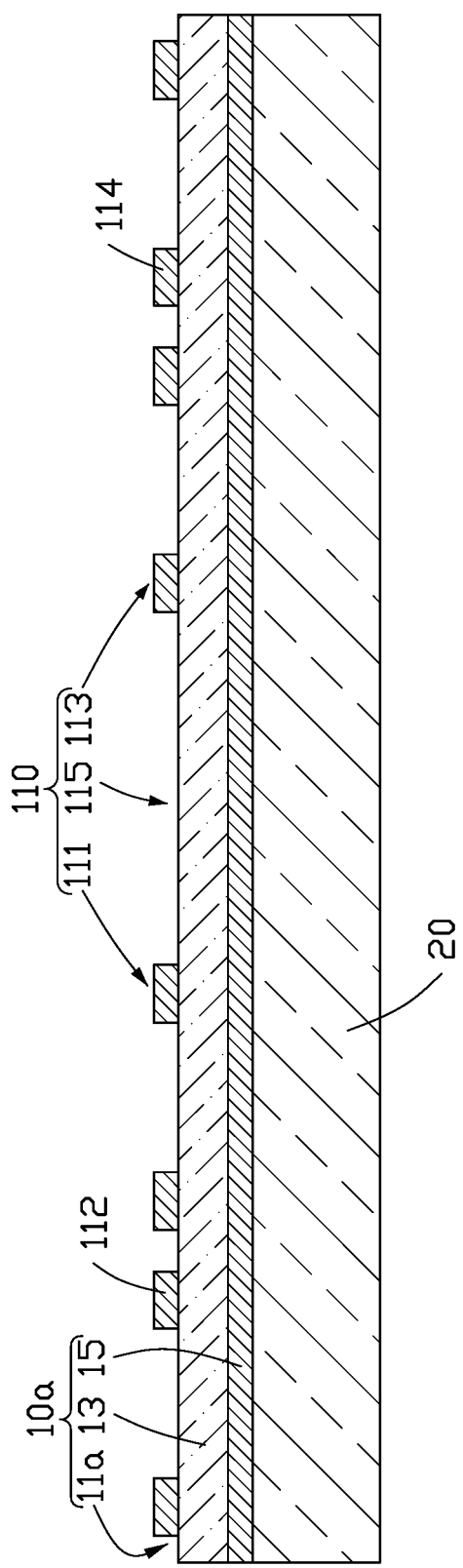
FIG. 4 is a cross-sectional view of an embodiment of a flexible wiring board with the carrier of FIG. 3.

At block 203, referring to FIG. 4, a first wiring layer 11a is formed by performing a circuit fabrication process on the first metal foil 11, thereby obtaining a flexible wiring board 10a by the flexible double-sided metal-clad laminate 10 attached to the carrier 20. The first wiring layer 11a includes at least one manufacturing unit 110. Each of the at least one manufacturing unit 110 includes a first wiring region 111 and a second wiring region 113 spaced from each other. The first wiring region 111 includes at least one first connecting pad 112, and the second wiring region 113 includes at least one second connecting pad 114.

In at least one embodiment, each of the at least one manufacturing unit 110 may include a gap 115 between the first wiring region 111 and the second wiring region 113. A portion of the flexible dielectric layer 13 is exposed from the gap 115.

In at least one embodiment, the at least one first connecting pad 112 and the at least one second connecting pad 114 may be substantially symmetrical with respect to the gap 115.

Figure 5A:
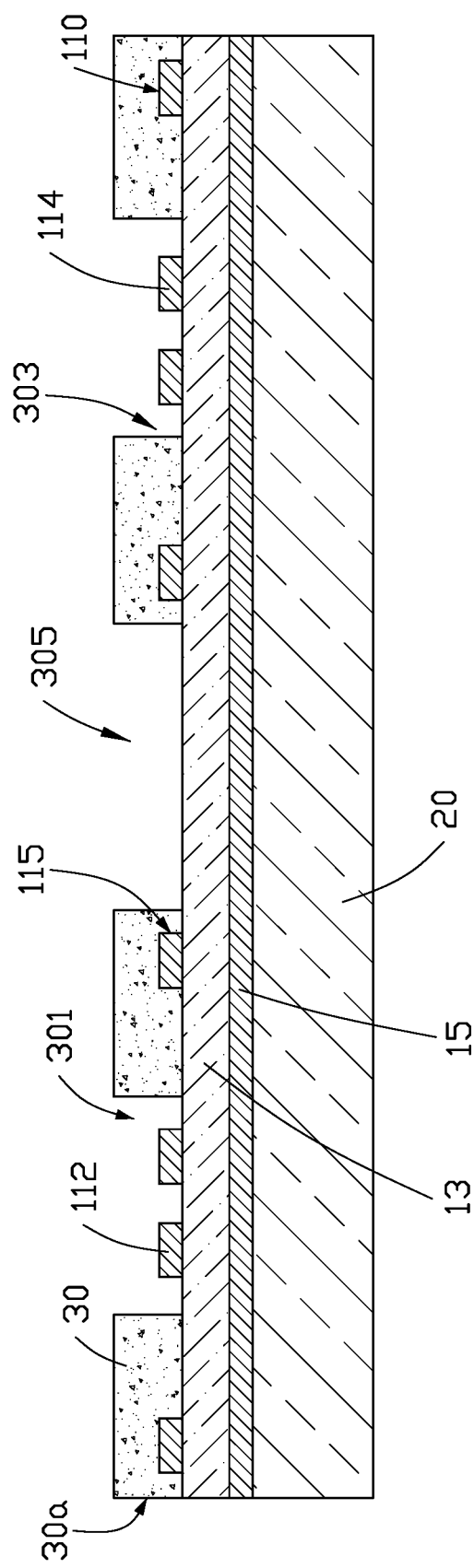
FIG. 5a is a cross-sectional view showing a rigid dielectric layer on the flexible wiring board of FIG. 4.

At block 204, referring to FIG. 5a, corresponding to each of at least one manufacturing unit 110, a plurality of rigid dielectric blocks 30 with uniform thickness are provided and pressed on a side of the flexible dielectric layer 13 facing away from the second metal foil 15 to form a rigid dielectric layer 30a. The plurality of rigid dielectric blocks 30 are surrounded to form at least one first groove 301 and at least one second groove 303. The at least one first connecting pad 112 is exposed from the at least one first groove 301, the at least one second connecting pad 114 is exposed from the at least one second groove 303. The plurality of rigid dielectric blocks 30 are surrounded to form an interval 305 corresponding to each of the at least one manufacturing unit 110. The at least one first groove 301 is located a first side of the interval 305, and the at least one second groove 303 is located a second side of the interval 305 opposite to the first side of the interval 305.

The gap 115 is at least partially exposed from the interval 305.

The at least one first groove 301 and the at least one second groove 303 may be mirror-symmetrical with respect to the interval 305.

Figure 5B:
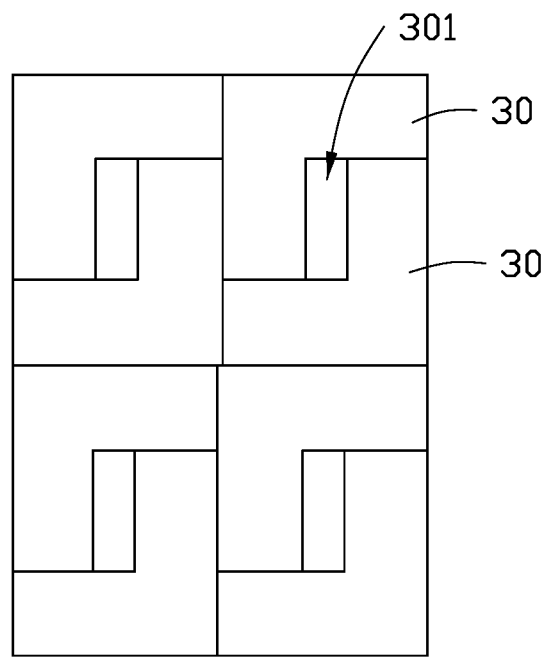
Figure 5C:
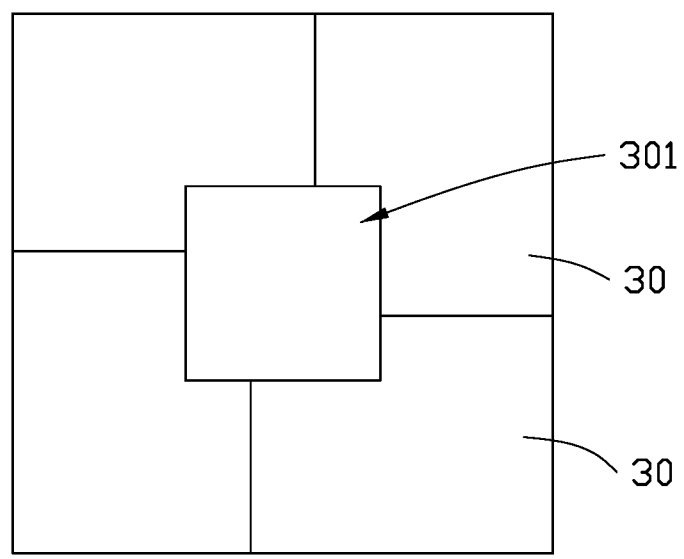

In at least one embodiment, each of the plurality of rigid dielectric blocks 30 may be in a shape of "⌊". At least two of the rigid dielectric blocks 30 each in a shape of "⌊" are surrounded to form one first groove 301, and at least another two of the rigid dielectric blocks 30 each in a shape of "⌊" are surrounded to form one second groove 303. A shape of the first groove 301 and a shape of the second groove 303 are mirror-symmetrical with respect to the interval 305. For example, as shown in FIG. 5b, two rigid dielectric blocks 30 each in a shape of "⌊" are surrounded to form a rectangular groove. Another example, as shown in FIG. 5c, two rigid dielectric blocks 30 each in a shape of "⌊" are surrounded to form a rectangular groove.

In at least one embodiment, each of the plurality of rigid dielectric blocks 30 may have another shape, and it is only necessary to ensure the shape of the first groove 301 and the shape of the second groove 303 are mirror-symmetrical with respect to the interval 305. For example, at least two rigid dielectric blocks 30 are surrounded to form a circular groove or a hexagonal groove.

Figure 6:
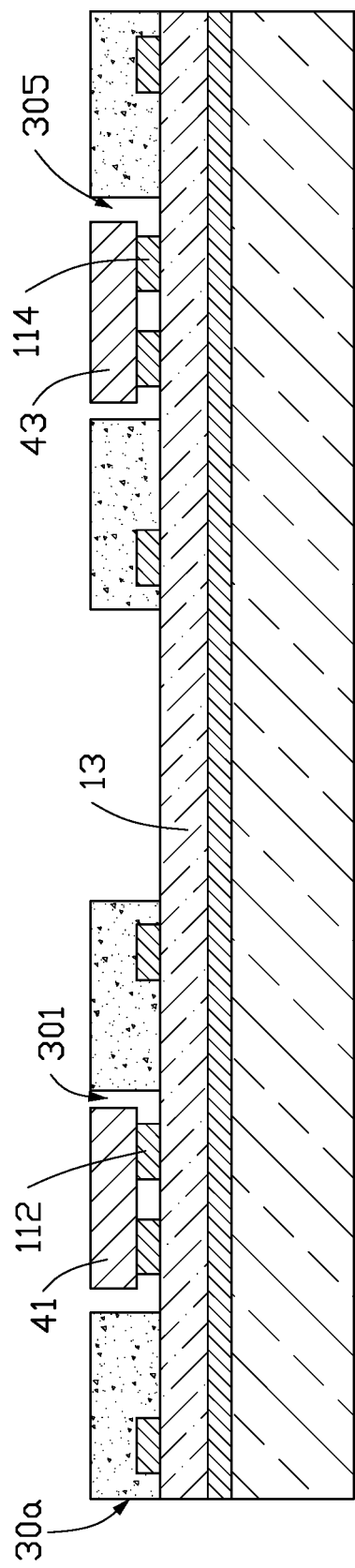

At block 205, referring to FIG. 6, a first electronic component 41 is received and fixed in each first groove 301, and electrically connected to the at least one first connecting pad 112.

In at least one embodiment, a surface of the first electronic component 41 facing away from the flexible dielectric layer 13 may be lower than a surface of the rigid dielectric layer 30a facing away from the flexible dielectric layer 13. So that the first electronic component 41 is completely buried in the first groove 301.

In at least one embodiment, the block 205 may further include fixing a second electronic component 43 in the second groove 303 and electrically connecting the second electronic component 43 to the at least one second connecting pad 114.

A surface of the second electronic component 43 facing away from the flexible dielectric layer 13 may be lower than a surface of the rigid dielectric layer 30a facing away from the flexible dielectric layer 13. So that the second electronic component 43 is completely buried in the second groove 303.

Figure 7:
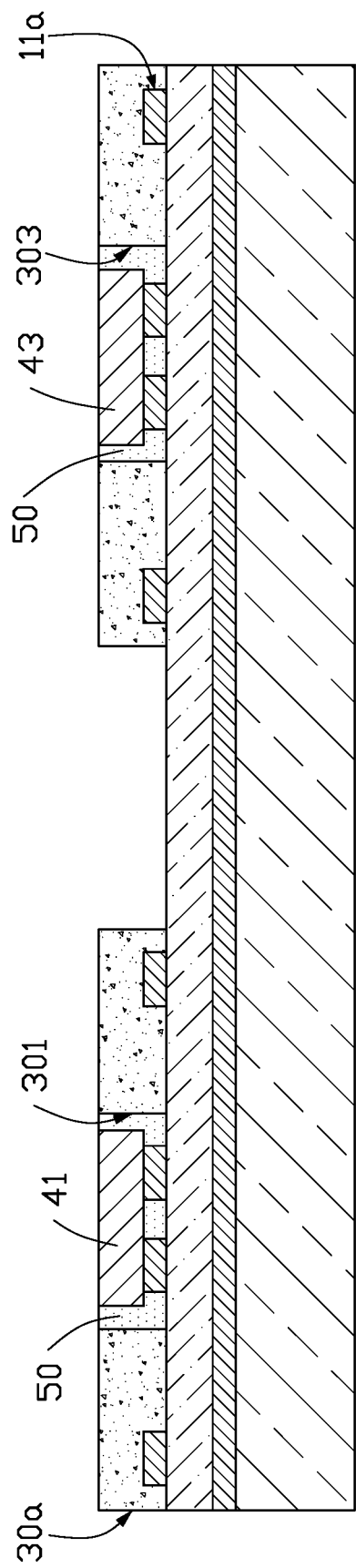
FIG. 7 is a cross-sectional view showing glue formed on the flexible wiring board of FIG. 6.

At block 206, referring to FIG. 7, glue 50 fills in the first groove 301 where the first electronic component 41 is received in to further fix the first electronic component 41, the first wiring layer 11a, and the rigid dielectric layer 30a.

In at least one embodiment, the block 206 may further include filling glue 50 in the second groove 303 where the second electronic component 43 is received in to further fix the second electronic component 43, the first wiring layer 11a, and the rigid dielectric layer 30a.

In at least one embodiment, the block 206 may be omitted.

Figure 8:
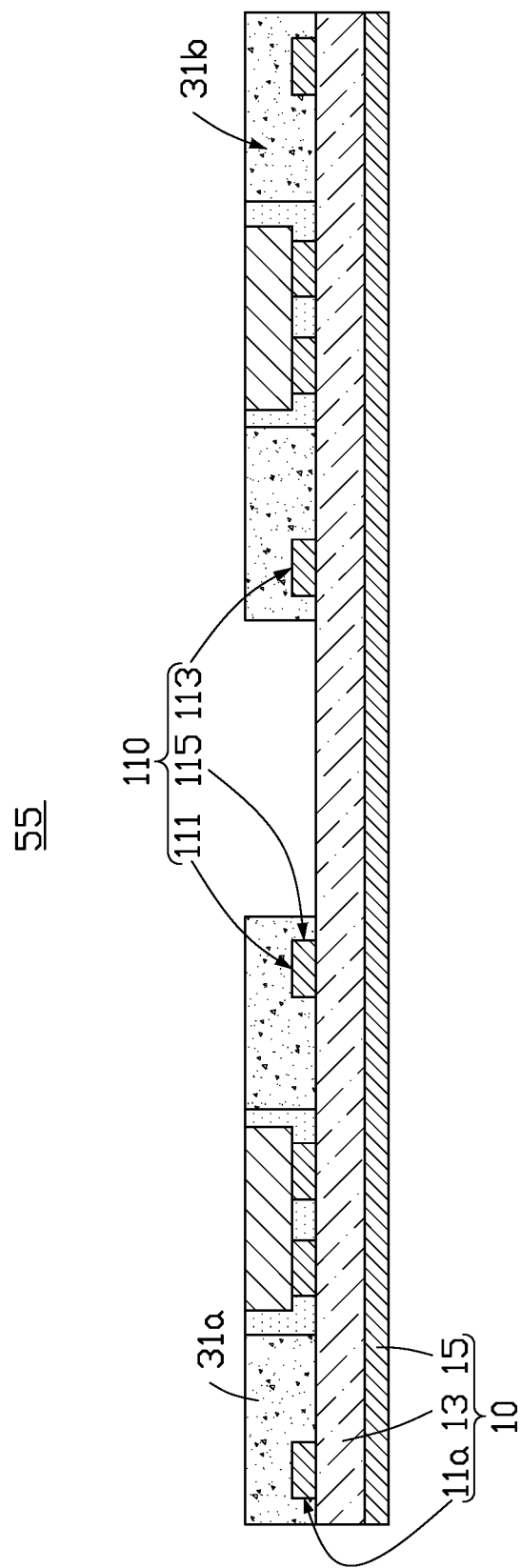
FIG. 8 is a cross-sectional view of an embodiment of an intermediate structure.

At block 207, referring to FIG. 8, the carrier 20 is removed to obtain an intermediate structure 55.

In at least one embodiment, if the first wiring layer 11a includes a plurality of the manufacturing unit 110, after the block 207, the method may further include dividing the flexible wiring board 10a including the plurality of the manufacturing unit 110, thereby obtaining the intermediate structure 55 corresponding to each of the plurality of the manufacturing unit 110.

Figure 9:
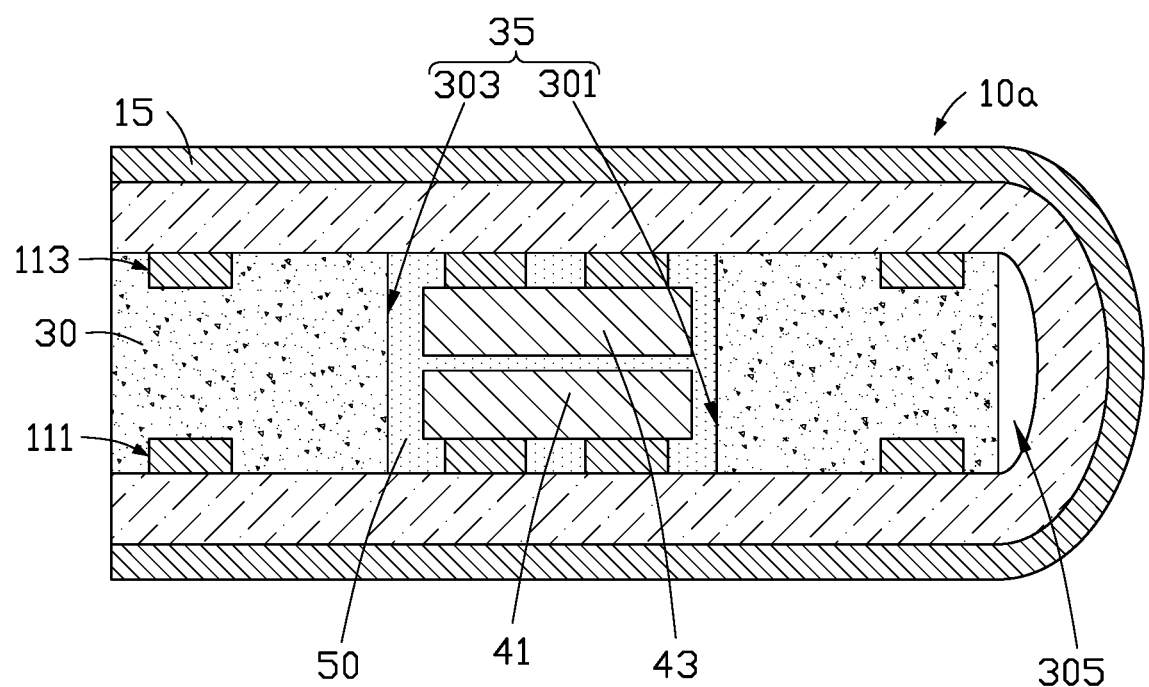
FIG. 9 is a cross-sectional view showing the intermediate structure of FIG. 8 bent and pressed.

At block 208, referring to FIGS. 8 and 9, the intermediate structure 55 is bent along the interval 305 in a manner that the second metal foil 15 is outward, so that the first wiring region 111 and the second wiring region 113 are opposed to each other and pressed together. A first portion 31a of the rigid dielectric layer 30a combined with the first wiring region 111 and a second portion 3 1b of rigid dielectric layer 30a combined with second wiring region 113 are boned after being pressed together. The first groove 301 and the second groove 303 correspond to each other and cooperate to form a receiving cavity 35.

Figure 10:
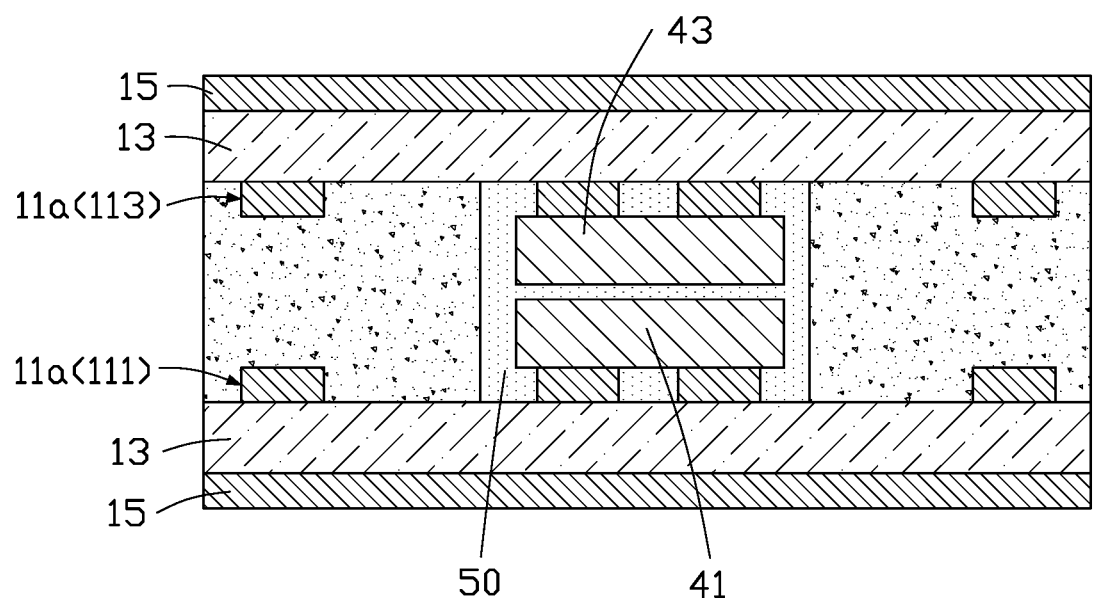
FIG. 10 is a cross-sectional view showing an area of the bent intermediate structure of FIG. 9 removed.

At block 209, referring to FIGS. 9 and 10, an area of the bent intermediate structure 55 corresponding to the interval 305 is removed.

In at least one embodiment, the block 209 may be omitted.

Figure 11:
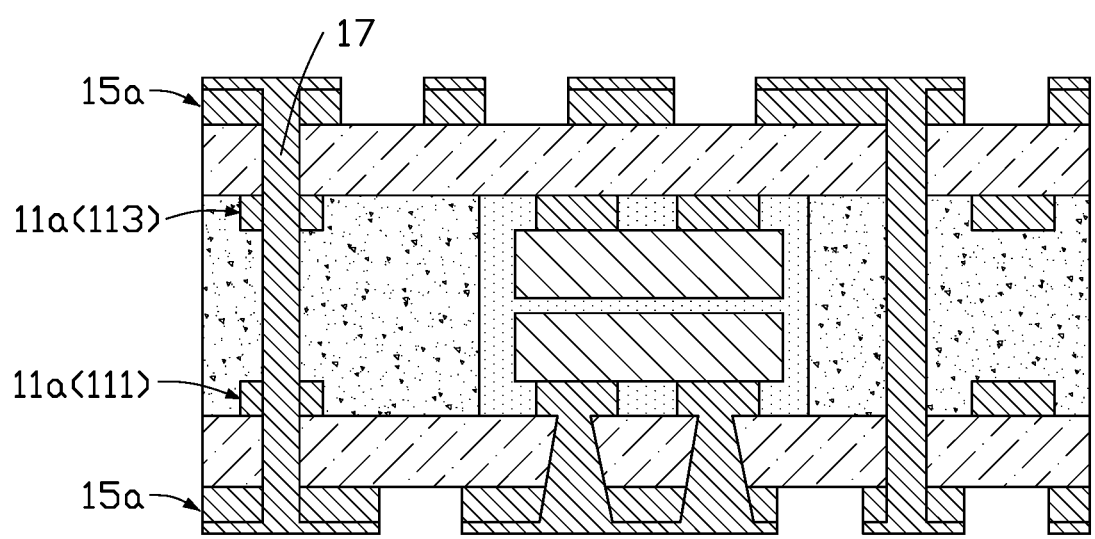
FIG. 11 is a cross-sectional view of an embodiment of a circuit board with at least one embedded electronic component.

At block 210, referring to FIG. 11, a second wiring layer 15a is formed by performing a circuit fabrication process on the second metal foil 15, thereby obtaining the circuit board 100 with at least one embedded electronic component.

In at least one embodiment, at least one conductive via 17 is formed by the circuit fabrication process on the second metal foil 15 to electrically connect the first wiring layer 11a and the second wiring layer 15a.

In the above method of for manufacturing a circuit board, the plurality of the rigid dielectric blocks 30 of specific shapes are arranged on the flexible double-sided metal-clad laminate 10 to be surrounded to form the groove for receiving the electronic component, thereby omitting a process for forming grooves in the flexible wiring board 10a, which facilitates the simplification of the method. By enclosing the plurality of the rigid dielectric blocks 30 of specific shapes to form a groove, it is convenient to adjust the shape and size of the groove so as to receive electronic components with different shapes and sizes. In addition, by bending and pressing the intermediate structure 55, a multilayer structure is formed while packaging electronic components, thereby reducing steps and saving time.

Further, the gap 115 is at least partially exposed from the interval 305, which facilitates the bending and pressing of the intermediate structure 55, thereby improving the stability of the circuit board 100.

Further, the first groove 301 and the second groove 303 may be mirror-symmetrical with respect to the interval 305, which is beneficial for the first groove 301 and the second groove 303 to completely correspond to each other when bending and pressing of the intermediate structure 55, thereby reducing the risk of damage to the electronic component in the groove.

Further, the surface of the second electronic component 43 facing away from the flexible dielectric layer 13 may be lower than a surface of the rigid dielectric layer 30a facing away from the flexible dielectric layer 13, thereby reducing the risk of damage to the electronic component in the groove.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for manufacturing a circuit board comprising:
    providing a flexible double-sided metal-clad laminate comprising a first metal foil, a flexible dielectric layer, and a second metal foil stacked in sequence;
    attaching a carrier on a side of the second metal foil facing away from the flexible dielectric layer;
    forming a first wiring layer by performing a circuit fabrication process on the first metal foil thereby obtaining a flexible wiring board by the flexible double-sided metal-clad laminate attached to the carrier, wherein the first wiring layer comprises at least one manufacturing unit, each of the at least one manufacturing unit comprises a first wiring region and a second wiring region spaced from each other, the first wiring region comprises at least one first connecting pad, and the second wiring region comprises at least one second connecting pad;
    providing and pressing a plurality of rigid dielectric blocks on a side of the flexible dielectric layer facing away from the second metal foil to form a rigid dielectric layer corresponding to each of the at least one manufacturing unit, wherein the plurality of rigid dielectric blocks are surrounded to form an interval, at least one first groove, and at least one second groove, the at least one first connecting pad is exposed from the at least one first groove, the at least one second connecting pad is exposed from the at least one second groove, the at least one first groove is located a first side of the interval, and the at least one second groove is located a second side of the interval opposite to the first side of the interval;
    fixing a first electronic component in each of the at least one first groove, wherein the first electronic component is electrically connected to the at least one first connecting pad;
    removing the carrier from a side of the flexible wiring board provided with the first electronic component, thereby obtaining an intermediate structure;
    bending the intermediate structure along the interval in a manner that the second metal foil is outward, wherein the first wiring region and the second wiring region are opposed to each other and pressed together, each of the at least one first groove and one of the at least one second groove correspond to each other and cooperate to form a receiving cavity; and
    forming a second wiring layer by performing a circuit fabrication process on the bent second metal foil, thereby obtaining the circuit board.

2. The method of claim 1, wherein each of the at least one manufacturing unit further comprises a gap between the first wiring region and the second wiring region, a portion of the flexible dielectric layer is exposed from the gap; the gap is at least partially exposed from the interval.

3. The method of claim 1, wherein each of the at least one first groove and one of the at least one second groove are mirror-symmetrical with respect to the interval.

4. The method of claim 1, wherein before removing the carrier to obtain the intermediate structure, further comprising:
    filling glue in the first groove where the first electronic component is fixed in.

5. The method of claim 1, wherein before removing the carrier to obtain the intermediate structure, further comprising:
    fixing a second electronic component each of the at least one second groove, wherein the second electronic component is electrically connected to the at least one second connecting pad.

6. The method of claim 5, wherein before removing the carrier to obtain the intermediate structure, further comprising:
    filling glue in the second groove where the second electronic component is fixed in.

7. The method of claim 5, wherein a surface of the first electronic component facing away from the flexible dielectric layer is lower than a surface of the rigid dielectric layer facing away from the flexible dielectric layer, a surface of the second electronic component facing away from the flexible dielectric layer is lower than a surface of the rigid dielectric layer facing away from the flexible dielectric layer.

8. The method of claim 1, wherein the first wiring layer comprises a plurality of manufacturing unit, the step of removing the carrier from a side of the flexible wiring board provided with the first electronic component, thereby obtaining an intermediate structure further comprises:
    removing the carrier from a side of the flexible wiring board provided with the first electronic component; and
    dividing the flexible wiring board comprising the plurality of manufacturing unit, thereby obtaining the intermediate structure corresponding to each of the plurality of the manufacturing unit.

9. The method of claim 1, wherein before the step of forming a second wiring layer by performing a circuit fabrication process on the bent second metal foil, thereby obtaining the circuit board, further comprising:
    removing an area of the bent intermediate structure corresponding to the interval.

* * * * *